(12) United States Patent
Chang

(10) Patent No.: US 12,396,314 B2
(45) Date of Patent: Aug. 19, 2025

(54) METHOD OF PATTERNING A SEMICONDUCTOR LAYER

(71) Applicant: Raynergy Tek Incorporation, Hsinchu (TW)

(72) Inventor: Yi-Ming Chang, Hsinchu (TW)

(73) Assignee: Raynergy Tek Incorporation, Hsinchu (TW)

( * ) Notice: Subject to any disclaimer, the term of this patent is extended or adjusted under 35 U.S.C. 154(b) by 420 days.

(21) Appl. No.: 17/819,792

(22) Filed: Aug. 15, 2022

(65) Prior Publication Data

US 2023/0371293 A1    Nov. 16, 2023

(30) Foreign Application Priority Data

May 11, 2022    (TW) .................................. 111117724

(51) Int. Cl.
*H10K 30/81*  (2023.01)
*H10K 71/00*  (2023.01)

(52) U.S. Cl.
CPC .......... *H10K 30/81* (2023.02); *H10K 71/621* (2023.02)

(58) Field of Classification Search
None
See application file for complete search history.

(56) References Cited

U.S. PATENT DOCUMENTS

| 2010/0207112 A1 | 8/2010 | Fuerst et al. | |
| 2018/0261656 A1* | 9/2018 | Kim | H10K 71/221 |
| 2021/0249637 A1* | 8/2021 | Wang | H10K 50/11 |

FOREIGN PATENT DOCUMENTS

| GB | 2554422 A | 4/2018 |
| JP | 2009260134 A | 11/2009 |
| JP | 2019506733 A | 3/2019 |
| JP | 2020515326 A | 5/2020 |
| WO | 2020031404 A1 | 2/2020 |

* cited by examiner

*Primary Examiner* — Daniel Whalen
(74) *Attorney, Agent, or Firm* — Joseph C. Zucchero; Carolyn S. Elmore; Elmore Patent Law Group, P.C.

(57) ABSTRACT

A method of patterning semiconductor layer includes the following operations. A first electrode and a second electrode are formed within a substrate. A patterned polymer layer with a first portion on a portion of the second electrode and a second portion on an edge portion of the substrate is formed on the substrate. A semiconductor layer is deposited on the patterned polymer layer, the substrate, and the first electrode. The first portion of the patterned polymer layer and the semiconductor layer on the first portion are removed to form a through-hole in the semiconductor layer that exposes the portion of the second electrode. A conductive block is deposited on the semiconductor layer and in the through-hole.

14 Claims, 21 Drawing Sheets

METHOD OF PATTERNING A SEMICONDUCTOR LAYER

CROSS-REFERENCE TO RELATED APPLICATION

This application claims priority to Taiwan Application Serial Number 111117724, filed May 11, 2022, which is herein incorporated by reference in its entirety.

BACKGROUND

Field of Invention

The present disclosure relates to a method of patterning a semiconductor layer.

Description of Related Art

Devices with active matrix driving or reading signals have many applications, such as active-matrix organic light-emitting diodes (AMOLED) and photodiode-based image sensors. With the gradual miniaturization of photodiodes in the semiconductor industry, a good photodiode needs to remove the material at the connection between the electrode and the external wire to avoid the formation of high resistance between the electrode and the external wire, which affects the current generation. Moreover, the material around the photodiode also needs to be removed to form a good package and maintain the stability of the functional devices. Therefore, it is very important that the material is removed cleanly and removed in a proper position during the photodiode manufacturing process.

In addition, the selection of photodiode materials has also developed from the previous silicon-based materials to organic semiconductor materials, quantum dot materials, or perovskite materials. The structure of the photodiodes has also changed to bottom-to-top layer stacking corresponding to the change of materials. The photoresist chemicals used in the fabrication process of this structure may be incompatible with emerging organic semiconductor materials, quantum dot materials, or perovskite materials. For example, the chemicals used in the lithography process may decompose organic semiconductor materials, quantum dots, and perovskite materials, making it difficult to pattern photodiodes based on perovskite materials, and it is difficult to obtain a good connection between the electrode and the external wire that does not cause high resistance or a good package that does not damage functional devices due to residual materials.

SUMMARY

The present disclosure relates to a method of patterning a semiconductor layer. In some embodiments, the method includes the following operations. A first electrode and a second electrode are formed within a substrate. A patterned polymer layer is formed on the substrate, in which the patterned polymer layer has a first portion located on a portion of the second electrode and a second portion located on an edge portion of the substrate. A semiconductor layer is deposited on the patterned polymer layer, the substrate, and the first electrode. The first portion of the patterned polymer layer and the semiconductor layer located on the first portion are removed to form a through-hole in the semiconductor layer and expose the portion of the second electrode. A conductive block is deposited on the semiconductor layer and in the through-hole.

In some embodiments, the method includes removing the second portion of the patterned polymer layer and the semiconductor layer located on the second portion to expose the edge portion of the substrate while removing the first portion of the patterned polymer layer and the semiconductor layer located on the first portion.

In some embodiments, the method includes removing the second portion of the patterned polymer layer and the semiconductor layer located on the second portion to expose the edge portion of the substrate after depositing the conductive block on the semiconductor layer and the through-hole.

In some embodiments, the semiconductor layer includes a photoactive layer, a carrier transport layer, or a combination thereof. The material of the photoactive layer includes organic semiconductors, quantum dots, perovskites, or combinations thereof.

In some embodiments, the patterned polymer layer includes an epoxy resin, a polyimide, an acrylic, or combinations thereof.

In some embodiments, the second portion of the patterned polymer layer has a continuous shape located on the edge portion of the substrate in the top view.

In some embodiments, the conductive block in the through-hole completely fills the through-hole.

In some embodiments, the first portion of the patterned polymer layer is removed by mechanically tearing off.

In some embodiments, the method further includes forming a package layer on the edge portion of the substrate after depositing the conductive block on the semiconductor layer and in the through-hole.

In some embodiments, the method includes forming a release layer on the substrate before forming a patterned polymer layer on the substrate and removing the release layer under the first portion while removing the first portion of the patterned polymer layer and the semiconductor layer located on the first portion.

In some embodiments, the method includes removing the second portion of the patterned polymer layer, the semiconductor layer on the second portion, and the release layer under the second portion to expose the edge portion of the substrate.

In some embodiments, the method includes removing the second portion of the patterned polymer layer, the semiconductor layer on the second portion, and the release layer under the second portion to expose the edge portion of the substrate while removing the release layer under the first portion.

In some embodiments, the method includes removing the second portion of the patterned polymer layer, the semiconductor layer on the second portion, and the release layer under the second portion to expose the edge portion of the substrate after depositing the conductive block on the semiconductor layer and in the through-hole.

In some embodiments, the release layer includes water-soluble polymers, fluorine-containing organic molecules, or combinations thereof.

In some embodiments, the water-soluble polymer has a hydroxyl group, an ether group, an amine group, or a sulfonic acid group.

BRIEF DESCRIPTION OF THE DRAWINGS

When reading the accompanying drawings of the present disclosure, an understanding of various aspects of the present disclosure is suggested from the following description. It is noted that, according to standard industry practice, the various feature dimensions are not drawn to scale. Various feature sizes may be arbitrarily increased or decreased to clarify the discussion.

DETAILED DESCRIPTION

Different embodiments are provided below to illustrate different features of the present disclosure. To simplify the present disclosure, specific examples of elements and configurations are presented below. Of course, these are only examples and are not intended to be limiting. For example, the description below that the first feature is formed above the second feature may include an embodiment in which the first feature and the second feature are formed in direct contact, and may also include embodiments in which other features formed between the first feature and the second feature so that the first feature and the second feature are not formed in direct contact.

Furthermore, spatially relative terms, such as below and above, etc., may be used herein to describe the relationship of one element or feature to another element or feature in the figures. In addition to the orientation depicted in the figures, spatially relative terms are intended to encompass different orientations of the device in use or operation. The device may be otherwise oriented (rotated 90 degrees or otherwise) and the description herein using spatial relative may likewise be interpreted accordingly. In the discussion herein, unless otherwise indicated, the same reference numbers in different figures refer to the same or similar elements formed by the same or similar methods using the same or similar materials.

The present disclosure provides a method of patterning a semiconductor layer, the method includes the following operations: A first electrode and a second electrode are formed within a substrate. A patterned polymer layer is formed on the substrate, in which the patterned polymer layer has a first portion on a portion of the second electrode and a second portion on an edge portion of the substrate. A semiconductor layer is deposited on the patterned polymer layer, the substrate, and the first electrode. The first portion of the patterned polymer layer and the semiconductor layer on the first portion are removed to form a through-hole in the semiconductor layer and expose the portion of the second electrode. A conductive block is deposited on the semiconductor layer and in the through-hole. Hereinafter, the method of patterning a semiconductor layer of the present disclosure will be described in detail according to embodiments.

Figure 1:
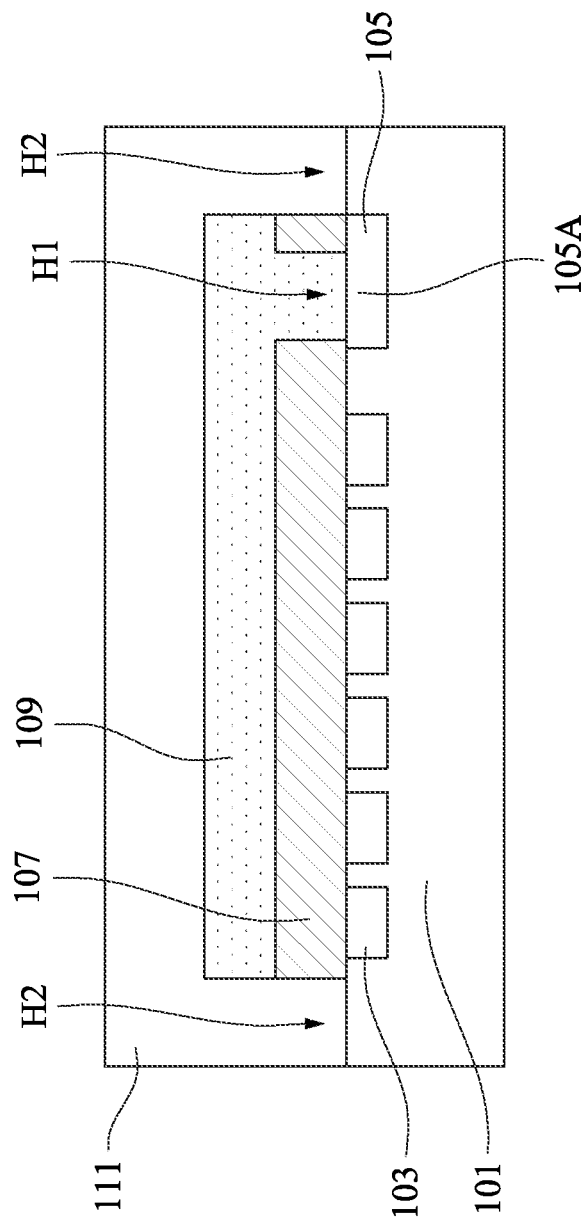
FIG. 1 is a cross-sectional view of a photodiode structure formed according to some embodiments of the present disclosure.
Figure 2:
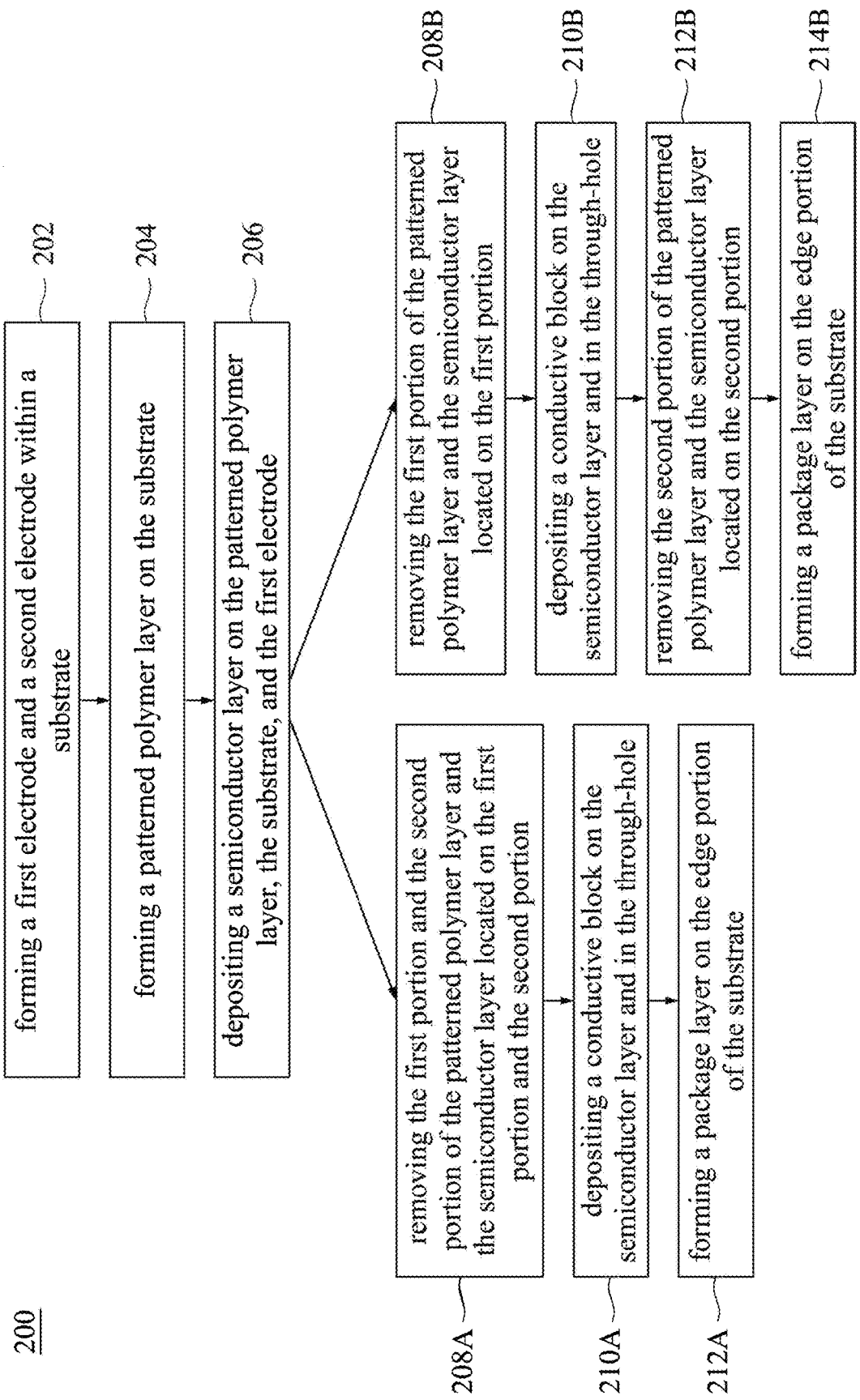
FIG. 2 is a flowchart of a method of patterning a semiconductor layer to form a photodiode structure according to some embodiments of the present disclosure.
Figure 3:
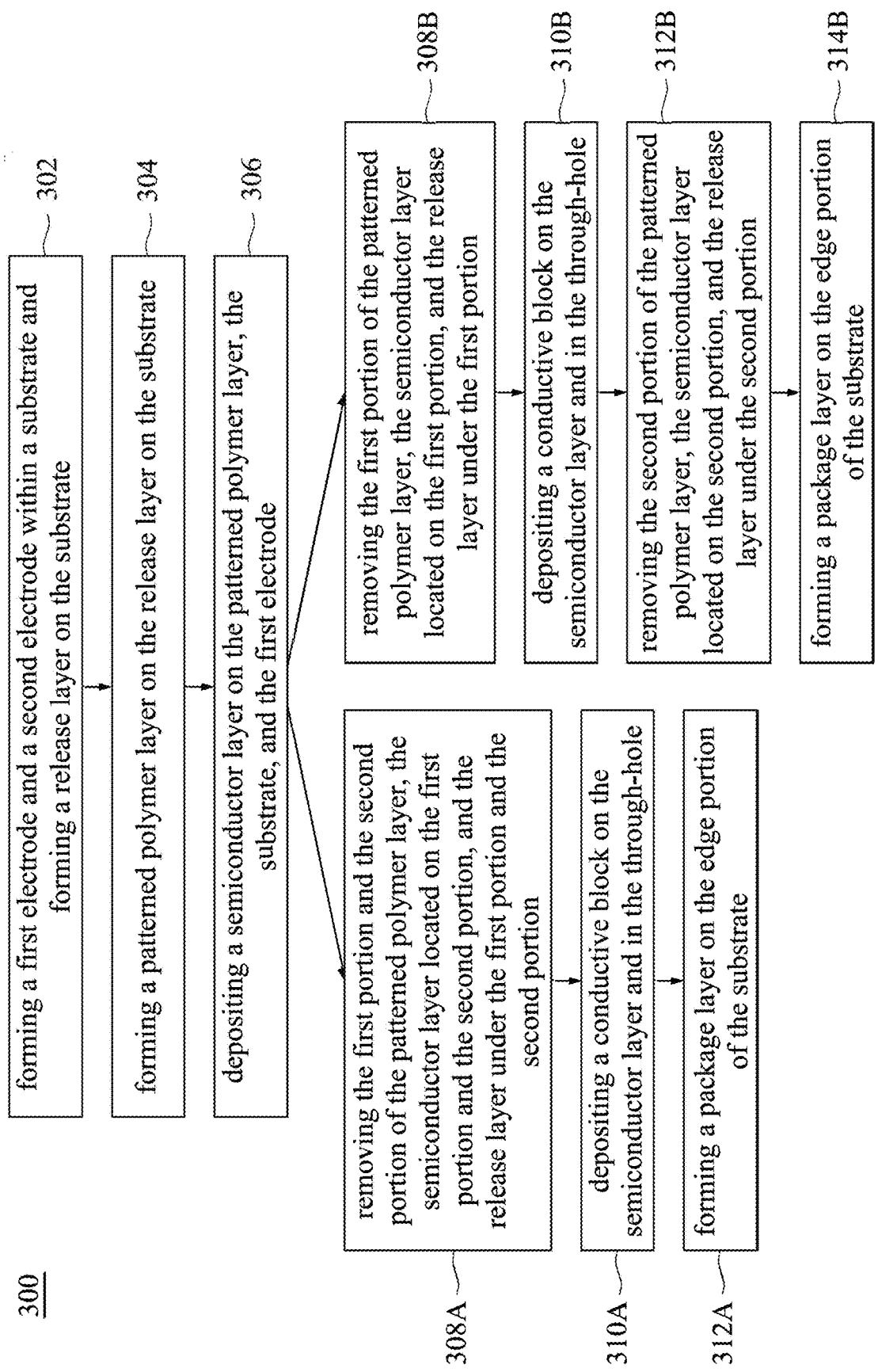
FIG. 3 is a flow diagram of a method of patterning a semiconductor layer to form a photodiode structure according to some embodiments of the present disclosure including a release layer.

FIG. 1 is a cross-sectional view of a photodiode structure formed according to some embodiments of the present disclosure. FIG. 2 and FIG. 3 are flowcharts of methods of patterning semiconductor layers to form photodiode structures according to some embodiments of the present disclosure. The difference between FIG. 2 and FIG. 3 is that the method in FIG. 3 further includes forming and removing a release layer. The photodiode structure in FIG. 1 includes a substrate 101, a first electrode 103, a second electrode 105, a semiconductor layer 107, a conductive block 109, a package layer 111, and a through-hole H1, in which the semiconductor layer 107 may include materials, such as organic semiconductors, quantum dots, perovskites, or combinations thereof, which are incompatible with the chemicals used in current lithography process and need to be formed by a solution-type process. That is, semiconductor layer 107 shown in FIG. 1 has the characteristics of being difficult to be patterned. However, the purpose of patterning the semiconductor layer 107 can be achieved by the methods shown in FIG. 2 and FIG. 3, in which the semiconductor layer 107 is formed on a patterned polymer layer (e.g., the patterned polymer layer 113 discussed below). The position where the patterned polymer layer 113 is formed corresponds to the position where the semiconductor layer 107 is about to be patterned. For example, the portion 105A of the second electrode 105 corresponds to the position of the through-hole H1 in the semiconductor layer 107. Thus, when the semiconductor layer 107 is formed on substrate 101 with the patterned polymer layer 113 thereon, the semiconductor layer 107 with a patterned polymer layer thereunder can be removed simultaneously by removing the patterned polymer layer, and the semiconductor layer 107 with no patterned polymer layer thereunder remains on the substrate 101 to achieve the purpose of patterning the semiconductor layer.

Figure 4:
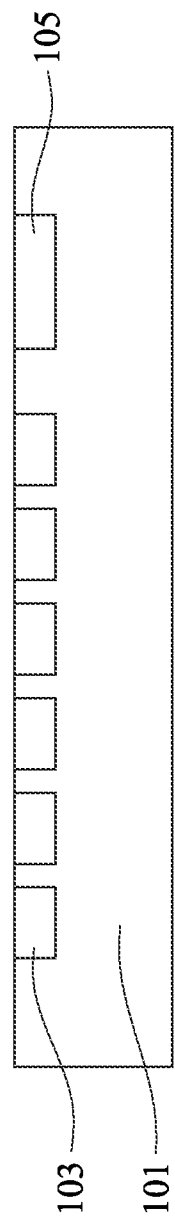
FIGS. 4-6 are cross-sectional views of intermediate stages of patterning a semiconductor layer to form a photodiode structure according to some embodiments of the present disclosure.

Next, the photodiode structure of FIG. 1 formed by a method 200 of patterning the semiconductor layer of FIG. 2 will be described in detail. In operation 202 of FIG. 2, the first electrode 103 and the second electrode 105 are formed within substrate 101 with reference to the intermediate stage cross-sectional view of forming the photodiode structure in FIG. 4. In some embodiments, the substrate 101 is a transparent substrate, such as a flexible polyethylene terephthalate (PET), a polyethylene naphthalate (PEN), a polyimide (PI) or, for example, a non-flexible glass substrate, and a silicon wafer-like substrate. In some embodiments, substrate 101 is a thin film transistor (TFT) substrate. In some embodiments, substrate 101 is a complementary metal oxide semiconductor (CMOS) substrate. In some embodiments, substrate 101 contains circuitry. In the embodiment shown in FIGS. 1 and 4, the first electrode 103 and the second electrode 105 are spatially separated from each other. In some embodiments, the first electrode 103 is a unit electrode. There may be a plurality of them as shown in FIG. 1 and FIG. 4, and they are separated from each other and arranged such as in arrays corresponding to the position of the pixel (not shown) in the semiconductor layer 107 to be formed thereon in subsequent processes. In some embodiments, the second electrode 105 is a connected electrode as shown in FIG. 1, connecting the conductive block 109 to be formed thereon in the subsequent process and connecting the driving or readout circuit (not shown) in the substrate 101 to form an electrical circuit. It should be noted that, for illustration, the substrate 101 of the present disclosure is a substrate of an element unit, and the drawings provided in the present disclosure only schematically depict a single element unit. However, those skilled in the art should know that, in the actual process, there may be multiple element units so that the substrate is a common substrate of multiple element units. And the operations to be discussed below are performed on the common substrate. The operation, such as forming a patterned polymer layer on a common substrate, allows each element unit to form a photodiode structure as in the drawings provided in present disclosure, including the through-hole and package layer discussed below.

Figure 5:
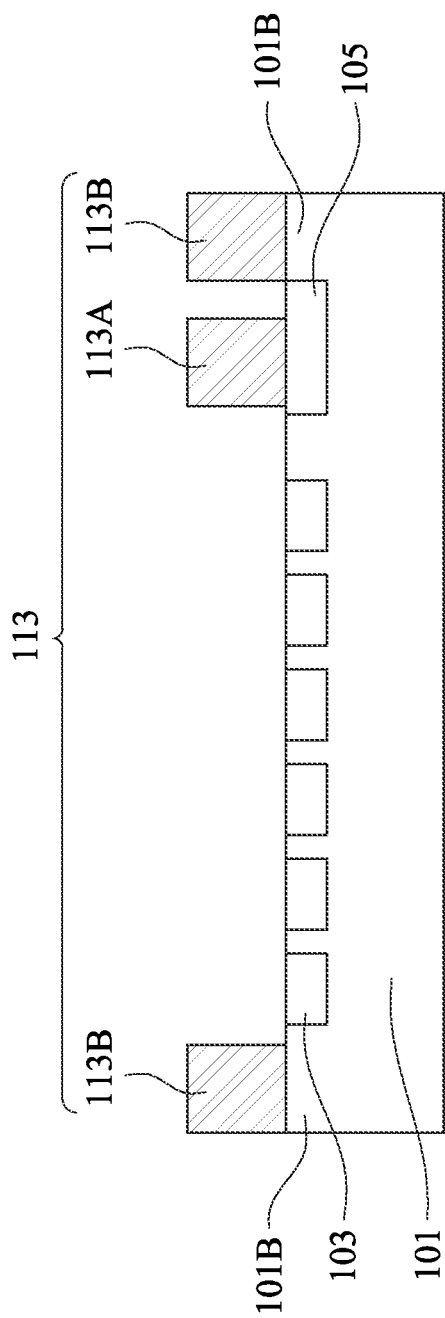

Next, in operation 204 of FIG. 2, also referring to the intermediate stage cross-sectional view of forming the photodiode structure in FIG. 5. The patterned polymer layer 113 is formed on the substrate 101, where the patterned polymer layer 113 has a first portion 113A on the portion 105A of the second electrode 105, and a second portion 113B on the edge portion 101B of the substrate 101, which define the position of the pattern where the semiconductor layer 107 to be formed thereon in a subsequent process. That is to say, the first portion 113A defines the position of the through-hole H1 in the semiconductor layer 107 in the photodiode structure in FIG. 1 so that the conductive block 109 can fill the through-hole H1 and then connect to the second electrode 105 to form an electrical circuit. The second portion 113B defines the position of the recess H2 in the semiconductor layer 107 in the photodiode structure in FIG. 1 so that the package layer 111 can cover the recess H2 and protect the photodiode structure from the infiltration of external oxygen or moisture, which may affect normal functioning. In some embodiments, the patterned polymer layer 113 may include epoxy resin, polyimide, acrylic, or combinations thereof, in which the polyimide is, for example, general polyimide or photosensitive polyimide amine. In some embodiments, the patterned polymer layer 113 may also include other materials that can be cured or cross-linked through heat, light, or chemical means. It should be noted that the patterned polymer layer 113 has mechanical toughness so that it will not be broken or broken when removed in subsequent processes, and can also be patterned by a lithography process or a necessary etching process. In some embodiments, the patterned polymer layer 113 is directly formed with the first portion 113A and the second portion 113B on the substrate 101 by printing, such as screen printing, inkjet, or stencil printing. In some embodiments, the patterned polymer layer 113 is formed by exposing and developing the polymer layer (not shown) on substrate 101 to form the first portion 113A and the second portion 113B. In some embodiments, the patterned polymer layer 113 is formed by laminating the dry film photoresist layer on the polymer layer (not shown) on the substrate 101, and then etching the polymer layer after defining the first portion 113A and the second portion 113B by exposing and developing the dry film photoresist layer to obtain a patterned polymer layer 113 having a first portion 113A and a second portion 113B, and finally, the dry film photoresist layer is removed. In some embodiments, the patterned polymer layer 113 is formed by spin coating a photoresist layer (not shown) on the polymer layer (not shown) on the substrate 101, and then etching the polymer layer after defining the first portion 113A and the second portion 113B by exposing and developing the dry film photoresist layer to obtain the patterned polymer layer 113 having the first portion 113A and the second portion 113B, and finally, the dry film photoresist layer is removed.

Figure 6:
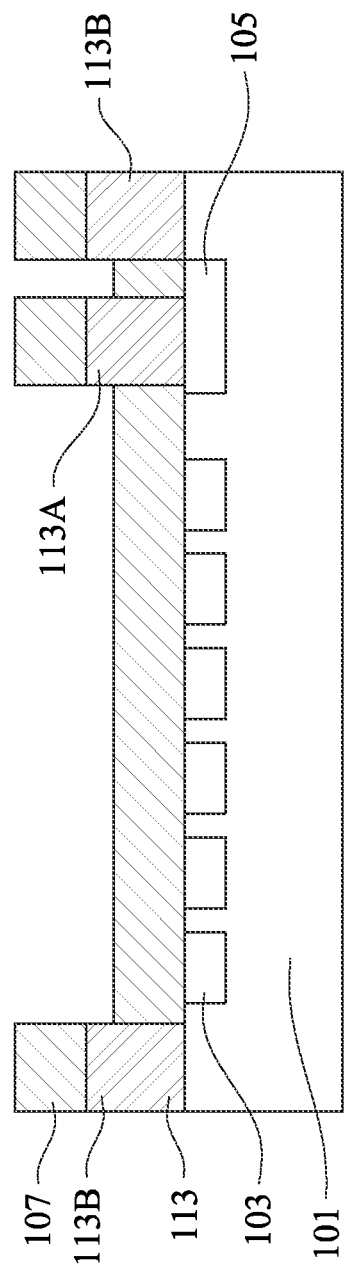
Figure 7:
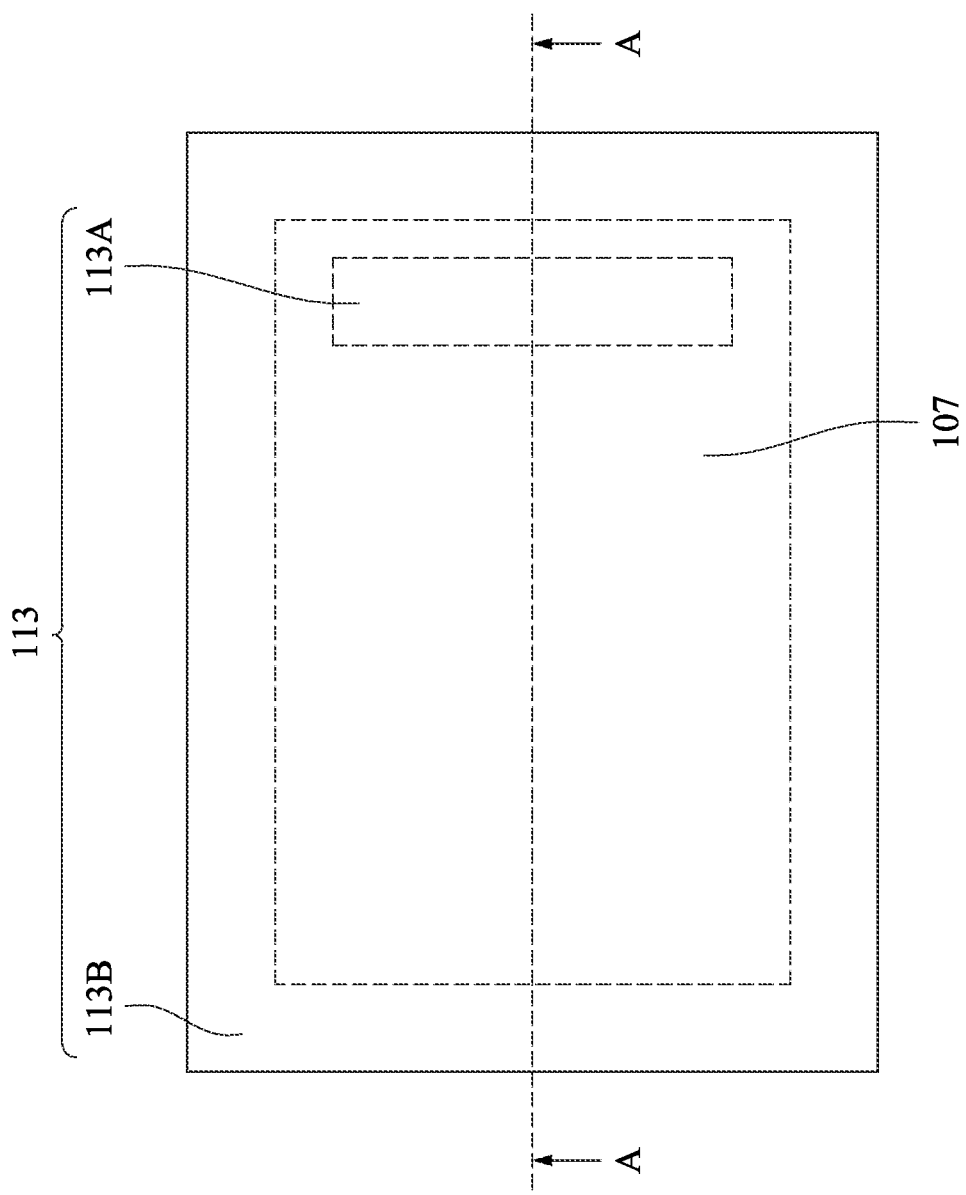
FIG. 7 is a top view of an intermediate stage of patterning a semiconductor layer to form a photodiode structure according to some embodiments of the present disclosure.

Next, in operation 206 of FIG. 2, referring to FIG. 6 and FIG. 7, the intermediate stage cross-sectional view and the top view of forming the photodiode structure, the semiconductor layer 107 is deposited on the patterned polymer layer 113, the substrate 101 and the first electrode 103. The semiconductor layer 107 includes a photoactive layer and necessary multiple layers of carrier transport layers (not shown), and the materials of the photoactive layer may include organic semiconductors, quantum dots, perovskites, or combinations thereof, such as a perovskite mineral quantum dot having the general formula $ABX_3$, in which A can be formamidinium (FA), methylammonium (MA), cesium or combinations thereof; B can be lead, tin or a combination thereof; and X can be a halogen, or, for example, an organic semiconductor Layer, such as P3HT:PCBM, PTB7:PCBM, PM6:Y6, conjugated polymer: fullerene derivative, conjugated polymer: non-fullerene acceptor, conjugated polymer: conjugated polymer, conjugated small molecule: conjugated small molecule, conjugated small molecule: conjugated Polymer, etc., but not limited to this, or cadmium selenide (CdSe), cadmium sulfide (CdS), zinc sulfide (ZnS), indium phosphide (InP), lead sulfide (PbS) and other quantum dot materials, but not limited thereto, or an organic semiconductor in a light emitting type, such as poly[2-methoxy-5-(2-ethylhexyloxy)-1,4-phenylenevinylene](MEH-PPV), but not limited thereto. The materials of the photoactive layer have excellent photoelectric conversion efficiency; however, due to their own characteristics, these materials are often formed by a solution-type process such as spin coating. In some embodiments, the semiconductor layer 107 is not limited to a single layer, for example, it may have a stack structure of multiple layers, and each has a carrier transport layer above and below the photoactive layer to help collect electrons and holes to the first electrode 103 and the conductive block 109 on semiconductor layer 107 to be discussed below. In the top view of FIG. 7, a line A-A marks the cross-sectional position of FIG. 6, and the dotted line marks the perspective location of the first portion 113A and the second portion 113B of the patterned polymer layer 113 covered by the semiconductor layer 107. It should be noted that the second portion 113B of the patterned polymer layer 113 has a continuous shape on the edge portion 101B of the substrate 101 in a top view shown in FIG. 7, in which a continuously wrapping rectangular strip is located at the edge of the photodiode structure and surround the internal elements, such as the first electrode 103 under the semiconductor layer 107, etc.

Figure 8A:
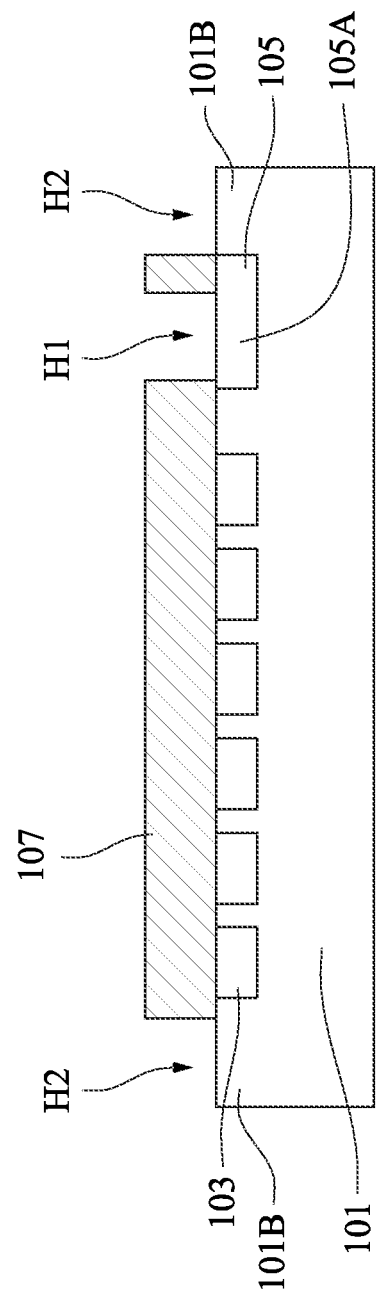
FIGS. 8A-8B are intermediate stage cross-sectional views of patterning a semiconductor layer to form a photodiode structure according to some embodiments of the present disclosure.

Next, in operation 208A of FIG. 2, also referring to FIG. 8A, the intermediate stage cross-sectional view of the photodiode structure, the second portion 113B of patterned polymer layer 113 and the semiconductor layer 107 thereon are removed while removing the first portion 113A of the patterned polymer layer 113 and the semiconductor layer 107 thereon to form a recess H2 in the semiconductor layer 107 and expose the edge portion 101B of the substrate 101. In FIG. 7, it is known that the second portion 113B of the patterned polymer layer 113 has a continuous shape on the edge portion 101B of the substrate 101 in a top view, therefore, removing the left and right parts of the second portion 113B as shown in FIG. 6 to obtain the recess H2 as shown in FIG. 8A is substantially removing them as one body. In some embodiments, the patterned polymer layer 113 is torn off mechanically. Since the patterned polymer layer 113 has mechanical toughness, it will not be broken or broken during tearing off. A patterned semiconductor layer 107 is obtained by operation 208A and has patterns of the through-hole H1 the recess H2 substantially free of residual semiconductor layer 107 thereon. The method for patterning a semiconductor layer provided by the present disclosure can not only pattern the semiconductor layer 107 that is incompatible with the lithography process due to its own characteristics (such as being miscible with the solvent used in the lithography process or causing chemical reactions, etc.) but also can be used to pattern the semiconductor layer 107 according to the desired pattern after the photodiode structure is miniaturized.

Figure 8B:
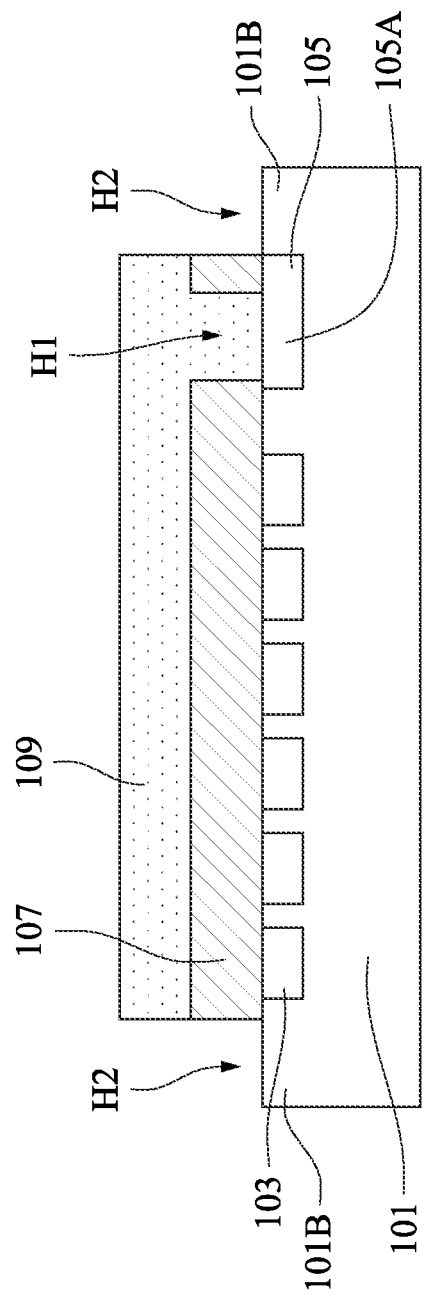

Next, in operation 210A of FIG. 2, also referring to FIG. 8B, the intermediate stage cross-sectional view of forming the photodiode structure, a conductive block 109 is deposited on the semiconductor layer 107 and in the through-hole H1. The conductive block 109 in the through-hole H1 completely fills the through-hole H1 and is well connected to the portion 105A of the second electrode 105, thus the resistance is not too high due to the presence of the semiconductor layer 107 in the through-hole H1, which may affect current generation. The conductive block 109 on the semiconductor layer 107 is spatially separated from the first electrode 103 by the semiconductor layer 107 to avoid short circuits caused by direct contact with the first electrode 103. In some embodiments, the conductive block 109 on the semiconductor layer 107 is a common electrode of the pixels in the semiconductor layer 107 compared to the unit electrodes arranged corresponding to the pixel positions in the semiconductor layer 107 such as the first electrode 103 shown in FIG. 1. In some embodiments, the materials of the conductive block 109 may be metal, such as aluminum, silver, molybdenum, copper, titanium, titanium nitride (TiN), etc.; metal oxides, such as indium tin oxide (ITO), etc.; carbon-based materials, such as carbon nanotubes, etc.; and organic conductive materials, etc. In some embodiments, the first electrode 103 acts as an anode, and the conductive block 109 on the semiconductor layer 107 acts as a cathode, or the first electrode 103 acts as a cathode and the conductive block 109 on the semiconductor layer 107 acts as an anode. In some embodiments, the anode and the cathode are connected to a voltage source (not shown) to collect the current generated by the semiconductor layer 107. In some embodiments, the transistor circuits and capacitors are disposed in the substrate 101. In some embodiments, the method of depositing the conductive block 109 includes the following operations: before depositing the conductive block 109, forming a mask (not shown) on the substrate 101 having the semiconductor layer 107 thereon, thus the mask covers the edge portion 101B of the substrate 101 and exposes the semiconductor layer 107 and the through-hole H1 therein, then depositing the conductive block 109 on the exposed parts from the mask, and then removing the mask to obtain the photodiode structure shown in the cross-sectional view of FIG. 8B, in which the edge portion 101B of the substrate 101 covered by the mask retains the pattern of the recess H2 of the semiconductor layer 107, and the package layer 111 can be formed thereon in the subsequent process.

Next, in operation 212A of FIG. 2, a package layer 111 is formed on the edge portion 101B of the substrate 101 as shown in FIG. 8B to obtain the photodiode structure as shown in FIG. 1. In some embodiments, the materials of the package layer 111 include silicon nitride, silicon oxynitride, silicon oxide, epoxy resin, etc., or combinations thereof.

Figure 9A:
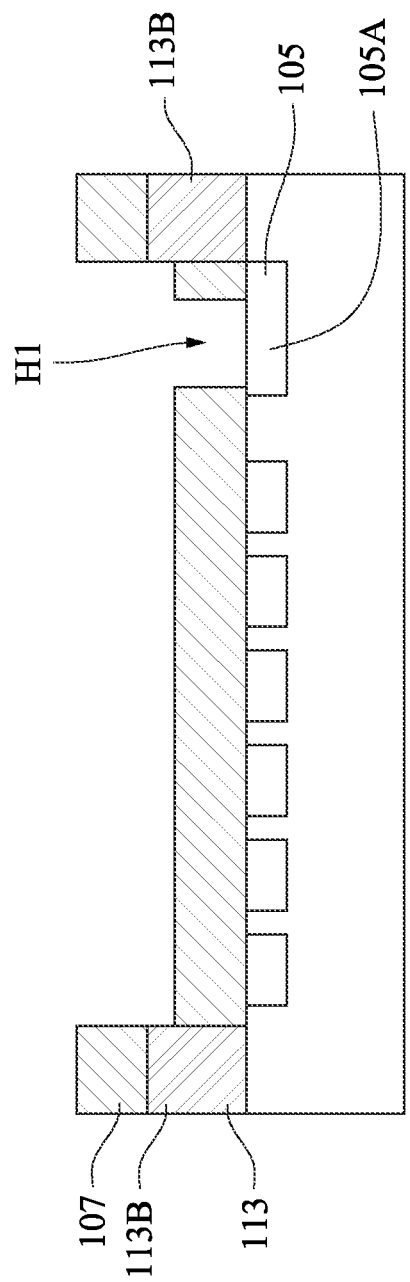
FIGS. 9A-9C are intermediate stage cross-sectional views of patterning a semiconductor layer to form a photodiode structure according to some embodiments of the present disclosure.
Figure 9B:
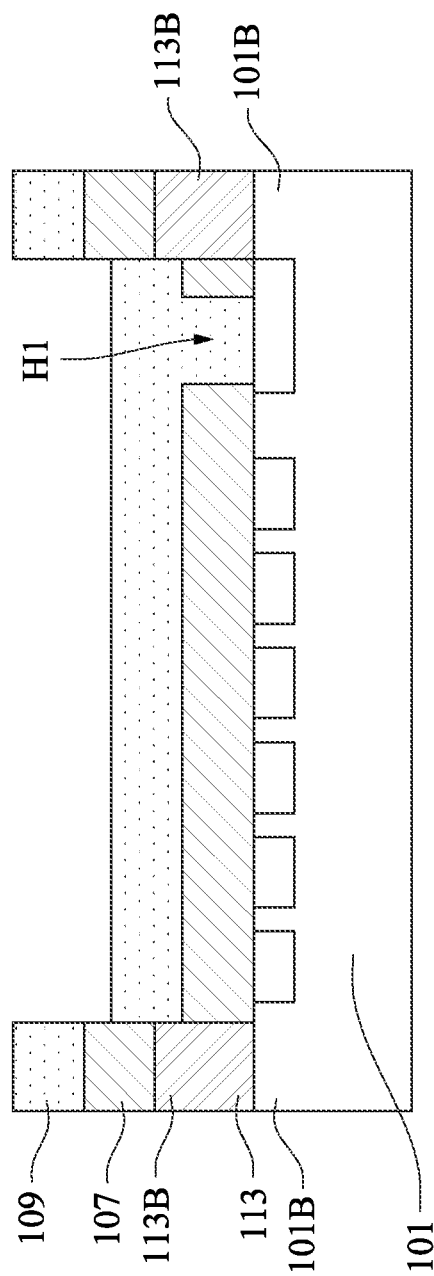
Figure 9C:
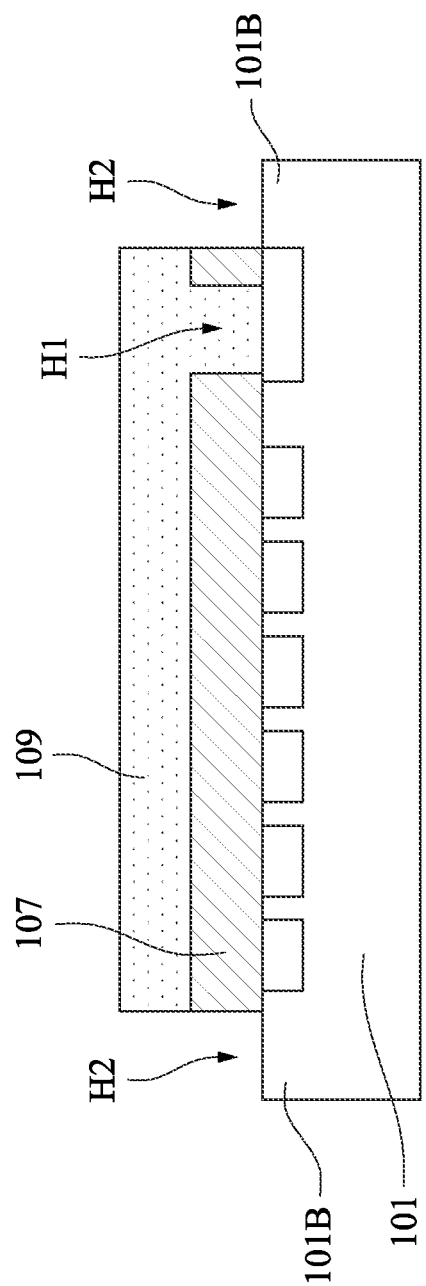

Next, returning to operation 206 of FIG. 2, in addition to continuing operation 208A to simultaneously remove the first portion 113A and the second portion 113B of the patterned polymer layer 113, operation 208B can be performed, and only the first portion 113A of the patterned polymer layer 113 is removed. In operation 208B, while referring to FIG. 9A, the intermediate stage cross-sectional view of forming the photodiode structure, the first portion 113A of the patterned polymer layer 113 and the semiconductor layer 107 thereon are removed to form the through-hole H1 in the semiconductor layer 107 and expose the portion 105A of the second electrode 105. Next, in operation 210B, while referring to FIG. 9B, the intermediate stage cross-sectional view of forming the photodiode structure, and a conductive block 109 is deposited on the semiconductor layer 107 and in the through-hole H1. Since the second portion 113B of the patterned polymer layer 113 is still on the edge portion 101B of the substrate 101, the second portion 113B can be used to define the location where to deposit the conductive block 109, thereby reducing the cost of additional process operation for patterning the conductive block 109, such as forming an additional mask to pattern the conductive block 109 in the above-mentioned operation 210A and making the material selection of the conductive block 109 more diverse for the materials of the conductive block 109 that are difficult to be patterned. Next, in operation 212B, while referring to FIG. 9C, the intermediate-stage cross-sectional view of forming the photodiode structure, the second portion 113B of the patterned polymer layer 113 and the semiconductor layer 107 thereon are removed after depositing the conductive block 109 on the semiconductor layer 107 and in the through-hole H1. The recess H2 is formed in the semiconductor layer 107 to expose the edge portion 101B of the substrate 101. Different from operations 208A-210A, operations 208B-212B can selectively remove the patterned polymer layer 113 at different positions in different process stages, that is, the first portion 113A and the second portion 113B Therefore, the patterning of the semiconductor layer 107 can also be selectively achieved, and the process method is more diverse. In addition, operation 208B and operation 212B are basically the same as operation 208A; operation 210B is basically the same as operation 210A, and details are not repeated here. In conclusion, operations 208B-212B are the same as operations 208A-210A, to obtain the patterns of the through-hole H1 and the recess H2 in the semiconductor layer 107, and the method provided by the present disclosure can still be used to pattern the semiconductor layer 107 according to the desired pattern after the miniaturization of the photodiode structure. After operations 208B-212B, operation 214B is performed to form a package layer 111 on the edge portion 101B of the substrate 101 as shown in FIG.

9C to obtain the photodiode structure as shown in FIG. 1. Operation 214B is basically the same as operation 212A, and details are not repeated here.

Figure 10:
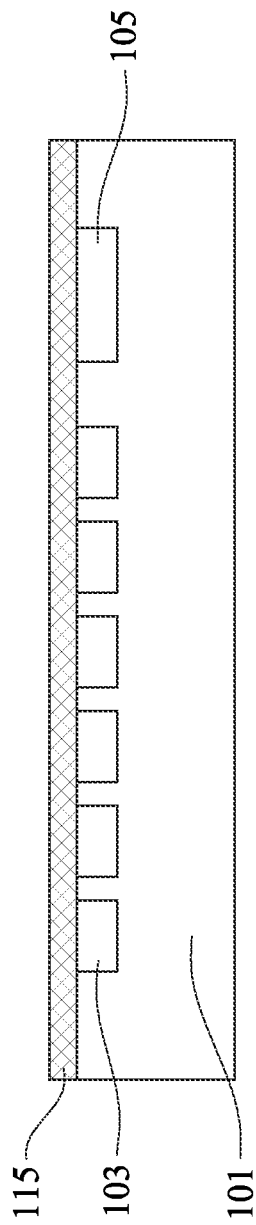
FIGS. 10-12 are intermediate stage cross-sectional views of patterning a semiconductor layer to form a photodiode structure according to some embodiments of the present disclosure including a release layer.

Next, the photodiode structure of FIG. 1 formed by a method 300 of patterning the semiconductor layer of FIG. 3 will be described in details. Different from FIG. 2, the method 300 of FIG. 3 further includes forming and removing a release layer. The release layer may include materials with low surface energy and/or low adhesion. In some embodiments, the release layer may include a water-soluble polymer, a fluorine-containing organic molecule, or a combination thereof. Specifically, the water-soluble polymers refer to polymer materials with cationic groups, anionic groups, or polar nonionic groups, such as hydroxyl groups, ether groups, sulfonic acid groups, and/or amine groups. In some embodiments, the water-soluble polymers may include polyvinyl alcohol, polystyrene sulfonic acid, polyacrylamide, or combinations thereof, but is not limited thereto. In some embodiments, the fluorine-containing organic molecules may include fluorine-based polymers, such as poly(1,1,2,2-tetrafluoroethylene) (PTFE), poly(1,1-difluoroethylene) (PVDF), derivatives of the above molecules, or combinations thereof. It should be noted that the purpose of the release layer is to reduce the adhesion of the patterned polymer layer on the substrate and to facilitate the removal of the patterned polymer layer from the substrate in the subsequent process. In detail, in method 200 of FIG. 2, the patterned polymer layer 113 is formed in direct contact with substrate 101 and has high adhesion. To make the patterned polymer layer 113 easier to be removed from substrate 101, an easily detached release layer is formed between the substrate 101 and the patterned polymer layer 113. In operation 302 of FIG. 3, also referring to FIG. 10, the intermediate stage cross-sectional view of forming the photodiode structure, the first electrode 103 and the second electrode 105 are formed within the substrate 101, and then the release layer 115 is formed thereon before forming the patterned polymer layer. Except for forming the release layer 115, operation 302 is basically the same as operation 202, and details are not repeated here.

Figure 11:
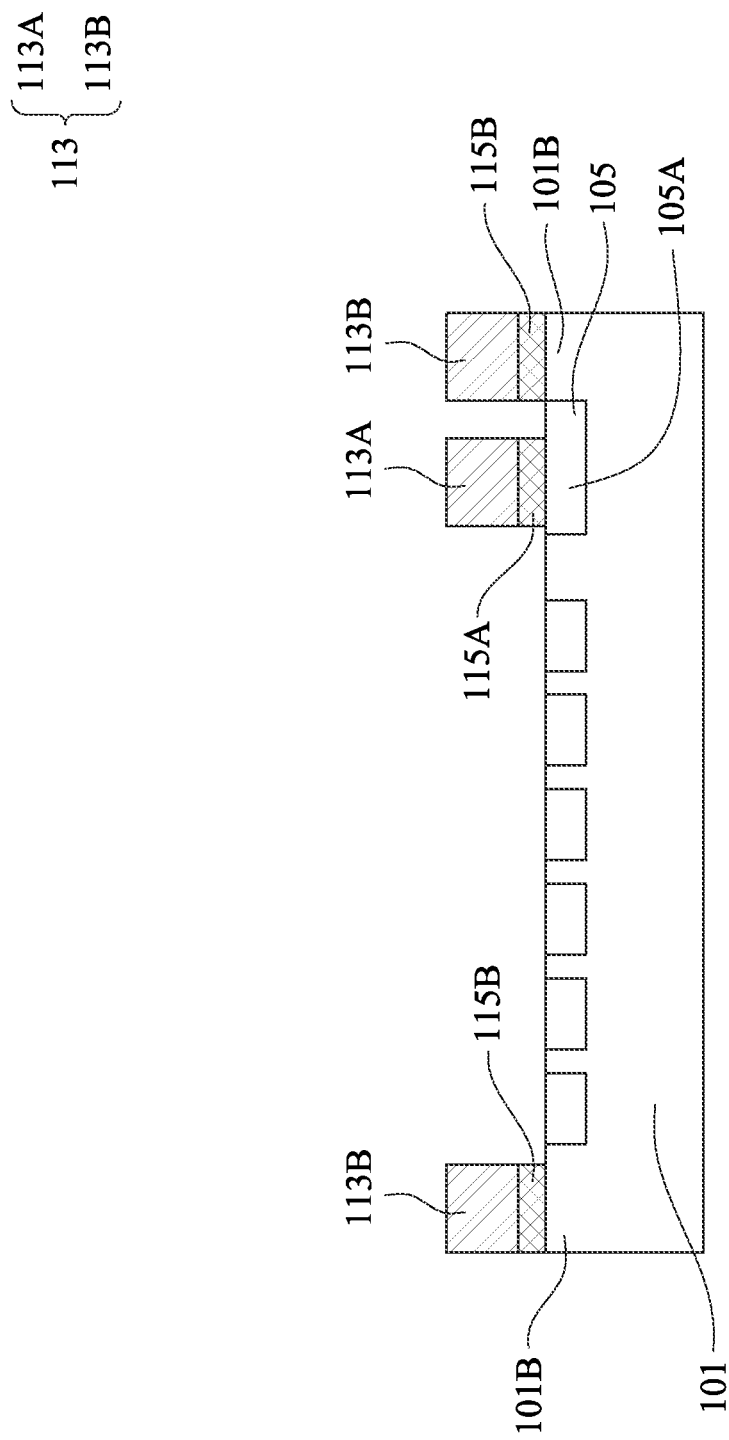

Next, in operation 304 of FIG. 3, also referring to the intermediate stage cross-sectional view of forming the photodiode structure in FIG. 11, the patterned polymer layer 113 is formed on the substrate 101, more precisely, on the release layer 115 above the substrate 101. Except for the release layer 115, operation 304 is basically the same as operation 204, and details are not repeated here. In addition, since the release layer 115 is easier detached from the substrate 101 than the patterned polymer layer 113, when the polymer layer (not shown) is patterned by the same method as operation 204, the patterned release layer 115 (not shown) can be simultaneously obtained as shown in FIG. 11. For example, in the embodiment in which the patterned polymer layer 113 is formed by exposing and developing the polymer layer (not shown) on the substrate 101 to form the first portion 113A and the second portion 113B, because the release layer 115 is more easily detached from the substrate 101, when the polymer layer is developed to form the patterned polymer layer 113, the release layer 115 under the uncured polymer layer is also developed and removed. That is to say, in addition to forming the patterned polymer layer 113 as in operation 204, operation 304 also forms the patterned release layer 115. Same as the patterned polymer layer 113, the patterned release layer 115 has the first portion 115A on the portion 105A of the second electrode 105, and the second portion 115B on the edge portion 101B of the substrate 101 as shown in FIG. 11.

Figure 12:
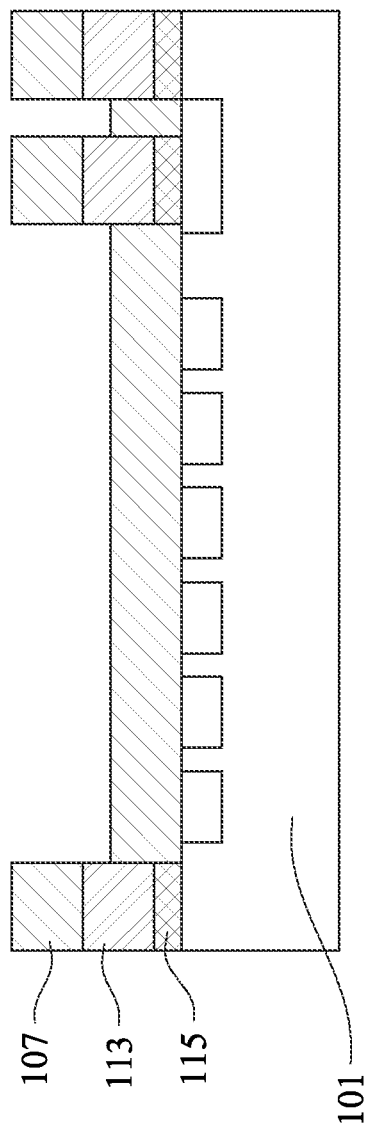
Figure 13:
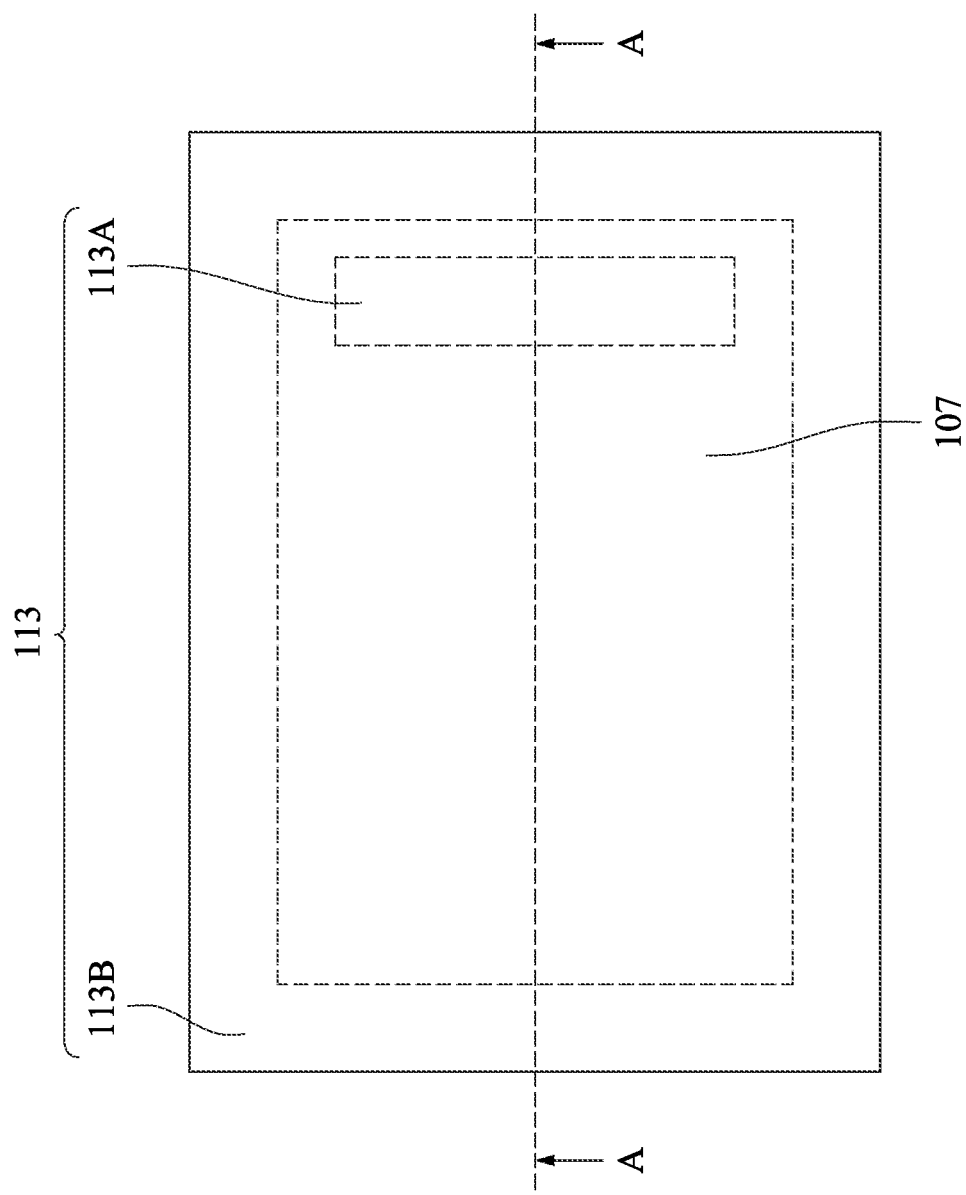
FIG. 13 is an intermediate stage top view of patterning a semiconductor layer to form a photodiode structure according to some embodiments of the present disclosure including a release layer.

Next, in operation 306 of FIG. 3, also referring to FIG. 12 and FIG. 13, the intermediate stage cross-sectional view and top view of forming the photodiode structure, the semiconductor layer 107 is deposited on the patterned polymer layer 113, the substrate 101, and the first electrode 103. Except for the release layer 115, operation 306 is basically the same as operation 206, and details are not repeated here.

Figure 14A:
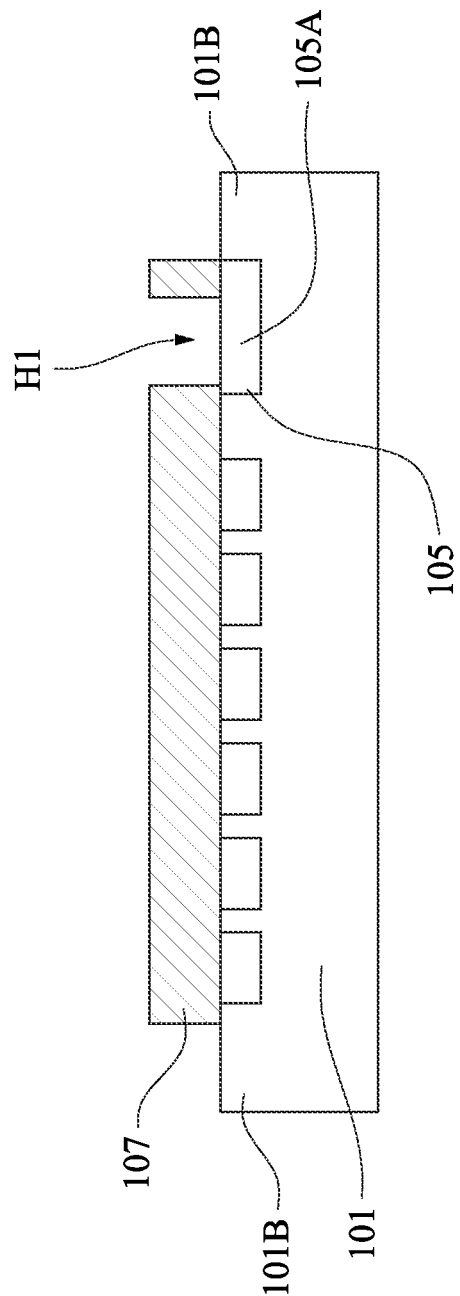
FIGS. 14A-14B are intermediate stage cross-sectional views of patterning a semiconductor layer to form a photodiode structure according to some embodiments of the present disclosure including a release layer.

Next, in operation 308A of FIG. 3, also referring to FIG. 14A, the intermediate stage cross-sectional view of forming the photodiode structure, the first portion 113A of the patterned polymer layer 113 and the semiconductor layer 107 thereon are removed to form the through-hole H1 in the semiconductor layer 107 and expose the portion 105A of the second electrode 105. Compared with operation 208A, operation 308A further includes the release layer 115. Since the release layer 115 is more easily detached from the substrate 101 when the first portion 113A of the patterned polymer layer 113 and the semiconductor layer 107 thereon are removed, the release layer 115 thereunder is removed simultaneously, that is, the first portion 115A of the release layer 115 is removed. Same as operation 208A, operation 308A further includes simultaneously removing the second portion 113B of the patterned polymer layer 113 and the semiconductor layer 107 thereon when removing the first portion 113A of the patterned polymer layer 113 and the semiconductor layer 107 thereon to form the recess H2 in the semiconductor layer 107 and expose the edge portion 101B of the substrate 101. Similarly, when the second portion 113B of the patterned polymer layer 113 and the semiconductor layer 107 thereon are removed, the release layer 115 thereunder is removed simultaneously, that is, the second portion 115B of the release layer 115 is removed. Except for the release layer 115, operation 308A is basically the same as operation 208A, and details are not repeated here. All in all, operation 308A is the same as operation 208A to obtain the patterns of the through-hole H1 and the recess H2 in the semiconductor layer 107, and the method provided by the present disclosure can still pattern the semiconductor layer 107 according to the desired pattern after the photodiode structure is miniaturized.

Figure 14B:
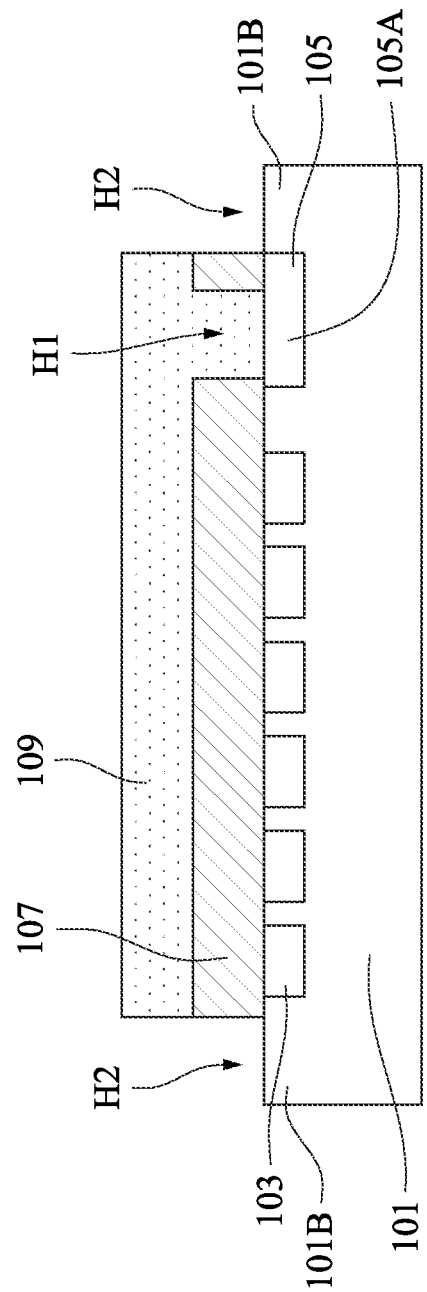

Next, in operation 310A of FIG. 3, also referring to FIG. 14B, the intermediate stage cross-sectional view of forming the photodiode structure, a conductive block 109 is deposited on the semiconductor layer 107 and in the through-hole H1. The conductive block 109 in the through-hole H1 completely fills the through-hole H1 and is well connected to the portion 105A of the second electrode 105. Since there is no semiconductor layer 107 in the through-hole H1, the resistance will not be too high to affect the current generation. The conductive block 109 on the semiconductor layer 107 is spatially separated from the first electrode 103 by the semiconductor layer 107 to avoid short circuits caused by direct contact with the first electrode 103. Operation 310A is basically the same as operation 210A, and details are not repeated here.

Next, in operation 312A of FIG. 3, a package layer 111 is formed on the edge portion 101B of the substrate 101 (as shown in FIG. 14B) to obtain the photodiode structure (as shown in FIG. 1). Operation 312A is basically the same as operation 212A, and details are not repeated here.

Figure 15A:
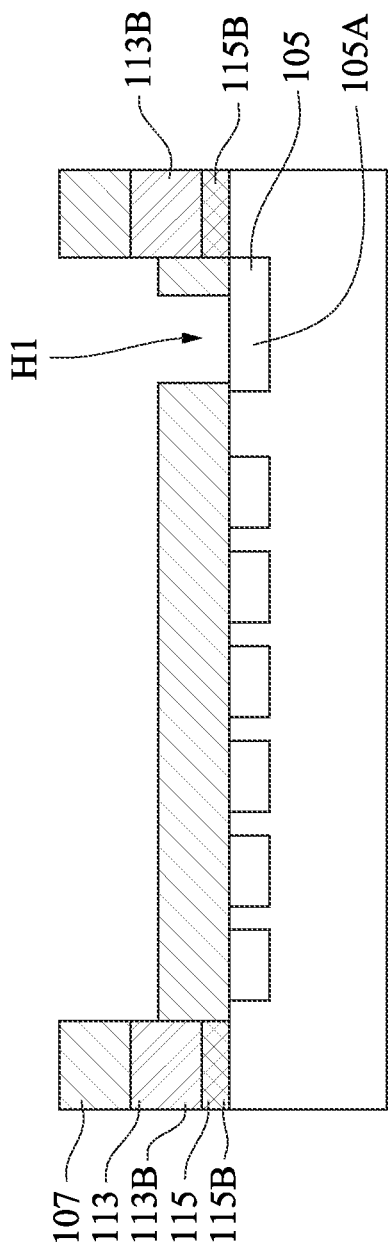
FIGS. 15A-15C are intermediate stage cross-sectional views of patterning a semiconductor layer to form a photodiode structure according to some embodiments of the present disclosure including a release layer.
Figure 15B:
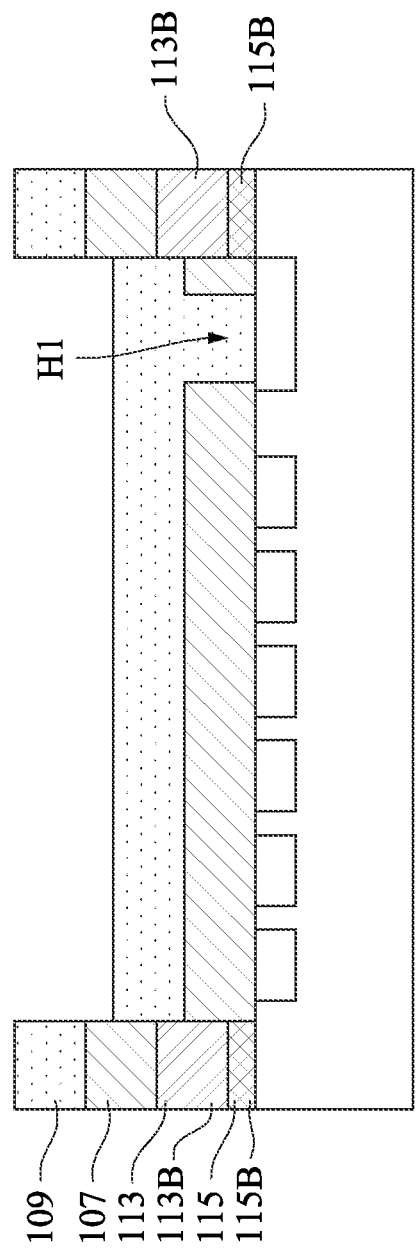
Figure 15C:
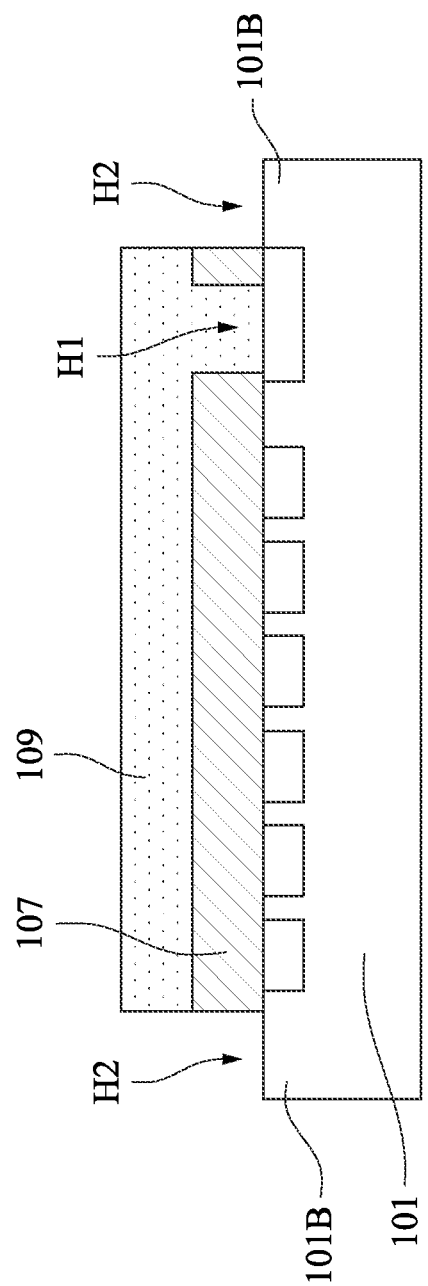

Next, returning to operation 306 of FIG. 3, in addition to continuing operation 308A to simultaneously remove the first portion 113A and the second portion 113B of the patterned polymer layer 113, operation 308B can be performed in which only the first portion 113A of the patterned polymer layer 113 is removed. In operation 308B, also referring to FIG. 15A, the intermediate stage cross-sectional view of forming the photodiode structure, the first portion 113A of the patterned polymer layer 113 and the semiconductor layer 107 thereon are removed to form the through-hole H1 in the semiconductor layer 107 and expose the portion 105A of the second electrode 105. Since operation 308B further includes the release layer 115, when the first portion 113A of the patterned polymer layer 113 and the semiconductor layer 107 thereon are removed, the release layer 115 thereunder will be removed simultaneously, that is, the first portion 115A of the release layer 115 is removed. Next, in operation 310B, also referring to FIG. 15B, the intermediate stage cross-sectional view of forming the photodiode structure, a conductive block 109 is deposited on the semiconductor layer 107 and in the through-hole H1. Except for the release layer 115, operation 310B is basically the same as operation 210B, and details are not repeated here. Next, in operation 312B, also referring to FIG. 15C, the intermediate stage cross-sectional view of forming the photodiode structure, after depositing the conductive block 109 on the semiconductor layer 107 and in the through-hole H1, the second portion 113B of the patterned polymer layer 113 and the semiconductor layer 107 thereon are removed to form a recess H2 in the semiconductor layer 107 and expose the edge portion 101B of the substrate 101. Similarly, when the second portion 113B of the patterned polymer layer 113 and the semiconductor layer 107 thereon are removed, the release layer 115 thereunder is removed simultaneously, that is, the second portion 115B of the release layer 115 is removed. Different from operations 308A-310A, operations 308B-312B can selectively remove the patterned polymer layer 113 at different positions in different process stages, such as the first portion 113A and the second portion 113B, so the patterning of the semiconductor layer 107 can be selectively achieved as well and the process method is more diverse. In addition, operation 308B and operation 312B are basically the same as operation 308A; operation 310B is basically the same as operation 310A, and details are not repeated here. To conclude, operations 308B-312B are the same as operations 308A-310A, to obtain the patterns of the through-hole H1 and the recess H2 in the semiconductor layer 107, and the method provided by the present disclosure can still pattern the semiconductor layer 107 according to the desired pattern after the photodiode structure is miniaturized. After operations 308B-312B, operation 314B is performed to form the package layer 111 on the edge portion 101B of the substrate 101 (as shown in FIG. 15C) to obtain the photodiode structure (as shown in FIG. 1). Operation 314B is basically the same as operation 312A, details are not repeated here.

The present disclosure provides a method of patterning a semiconductor layer. The semiconductor layer 107, which can only be coated on a photodiode structure by a solution-type process, is formed on a patterned polymer layer 113. When the semiconductor layer 107 is formed on the substrate 101 having the patterned polymer layer 113 thereon, the semiconductor layer 107 can be removed simultaneously by removing the patterned polymer layer 113 thereunder. The semiconductor layer 107 having no patterned polymer layer 113 thereunder remains. The desired pattern such as the through-hole H1 and the recess H2 in the semiconductor layer 107 can be obtained, thereby achieving the purpose of patterning the semiconductor layer 107 and solving the problem that the semiconductor layer 107 is difficult to be compatible with the chemicals used in the lithography process due to its own characteristics.

The foregoing outlines the features of some embodiments to enable those of ordinary skill in the art to better understand the aspects of the present disclosure. Those of ordinary skill in the art should realize that they may at any time utilize the present disclosure as a basis for designing or modifying other processes and structures for carrying out the same purposes and/or achieving the same advantages of the embodiments presented herein. Those of ordinary skill in the art should also realize that such equivalent constructions do not depart from the spirit and scope of the present disclosure and that they can make various changes, substitutions, and modifications herein without departing from the spirit and scope of the present disclosure.

What is claimed is:

1. A method of patterning a semiconductor layer, comprising:
    forming a first electrode and a second electrode within a substrate;
    forming a patterned polymer layer on the substrate, wherein the patterned polymer layer has a first portion located on a portion of the second electrode and a second portion located on an edge portion of the substrate;
    depositing the semiconductor layer on the patterned polymer layer, the substrate, and the first electrode;
    removing the first portion of the patterned polymer layer and the semiconductor layer located on the first portion to form a through-hole in the semiconductor layer to expose the portion of the second electrode; and
    depositing a conductive block on the semiconductor layer and in the through-hole, wherein the conductive block in the through-hole completely fills the through-hole.

2. The method of claim 1, further comprising:
    removing the second portion of the patterned polymer layer and the semiconductor layer located on the second portion to expose the edge portion of the substrate while removing the first portion of the patterned polymer layer and the semiconductor layer located on the first portion.

3. The method of claim 1, further comprising:
    after depositing the conductive block on the semiconductor layer and the through-hole,
    removing the second portion of the patterned polymer layer and the semiconductor layer located on the second portion to expose the edge portion of the substrate.

4. The method of claim 1, wherein the semiconductor layer comprises a photoactive layer, a carrier transport layer, or a combination thereof, and a material of the photoactive layer comprises an organic semiconductor, a quantum dot, a perovskite, or combinations thereof.

5. The method of claim 1, wherein the patterned polymer layer comprises an epoxy resin, a polyimide, an acrylic, or combinations thereof.

6. The method of claim 1, wherein the second portion of the patterned polymer layer has a continuous shape located on the edge portion of the substrate from a top view.

7. The method of claim 1, wherein the first portion of the patterned polymer layer is removed by mechanically tearing off.

8. The method of claim 1, further comprising:
    after depositing the conductive block on the semiconductor layer and in the through-hole, forming a package layer on the edge portion of the substrate.

9. The method of claim 1, further comprising:
    forming a release layer on the substrate before forming the patterned polymer layer on the substrate; and removing the release layer under the first portion while removing the first portion of the patterned polymer layer and the semiconductor layer located on the first portion.

10. The method of claim 9, further comprising:
removing the second portion of the patterned polymer layer, the semiconductor layer on the second portion, and the release layer under the second portion to expose the edge portion of the substrate.

11. The method of claim 9, further comprising:
removing the second portion of the patterned polymer layer, the semiconductor layer on the second portion, and the release layer under the second portion to expose the edge portion of the substrate while removing the release layer under the first portion.

12. The method of claim 9, further comprising:
after depositing the conductive block on the semiconductor layer and in the through-hole,
removing the second portion of the patterned polymer layer, the semiconductor layer on the second portion, and the release layer under the second portion to expose the edge portion of the substrate.

13. The method of claim 9, wherein the release layer comprises a water-soluble polymer, a fluorine-containing organic molecule, or a combination thereof.

14. The method of claim 13, wherein the water-soluble polymer has a hydroxyl group, an ether group, an amine group, or a sulfonic acid group.

* * * * *